(12) United States Patent
Sato

(10) Patent No.: US 7,233,225 B2
(45) Date of Patent: Jun. 19, 2007

(54) PLANAR TYPE FERRITE CORE

(75) Inventor: Hironori Sato, Chuo-ku (JP)

(73) Assignee: TDK Corporation, Tokyo (JP)

( * ) Notice: Subject to any disclaimer, the term of this patent is extended or adjusted under 35 U.S.C. 154(b) by 12 days.

(21) Appl. No.: 11/080,625

(22) Filed: Mar. 16, 2005

(65) Prior Publication Data

US 2005/0231316 A1  Oct. 20, 2005

(30) Foreign Application Priority Data

Mar. 30, 2004  (JP)  ............... 2004-098217

(51) Int. Cl.
*H01F 5/00* (2006.01)
*F01F 27/28* (2006.01)
(52) U.S. Cl. ............... 336/212; 336/223; 336/200
(58) Field of Classification Search ............ 336/212, 336/200, 83, 223, 232
See application file for complete search history.

(56) References Cited

U.S. PATENT DOCUMENTS 5,929,733 A * 7/1999 Anzawa et al. ............ 336/61
6,504,362 B2 * 1/2003 Saunders et al. ........... 324/210
6,696,913 B2 * 2/2004 Meuche et al. ............. 336/208
6,792,667 B2 * 9/2004 Roy et al. .................. 29/602.1

FOREIGN PATENT DOCUMENTS

JP  2003-151838  5/2003

* cited by examiner

*Primary Examiner*—Anh T. Mai
(74) *Attorney, Agent, or Firm*—Oliff & Berridge, PLC

(57) ABSTRACT

A planar type ferrite core having a rectangular shaped flat part, a pair of outside legs projecting out from two ends of the flat part in a direction substantially perpendicular to a plane of the flat part, and a center leg positioned between the pair of outside legs and projecting out from the flat part in the same direction as the outside legs, wherein the two ends of the center leg are formed with arc surfaces of a predetermined radius of curvature, and a length of the center leg in the longitudinal direction is at least 90% of a width of the flat part.

20 Claims, 3 Drawing Sheets

FIG. 3D
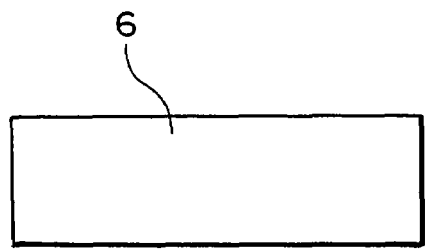
FIG. 3B  FIG. 3A  FIG. 3C
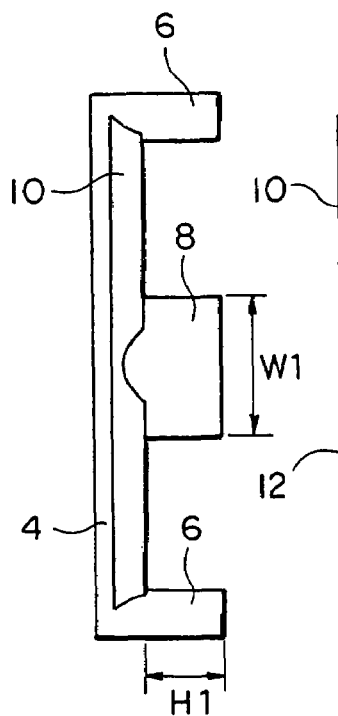 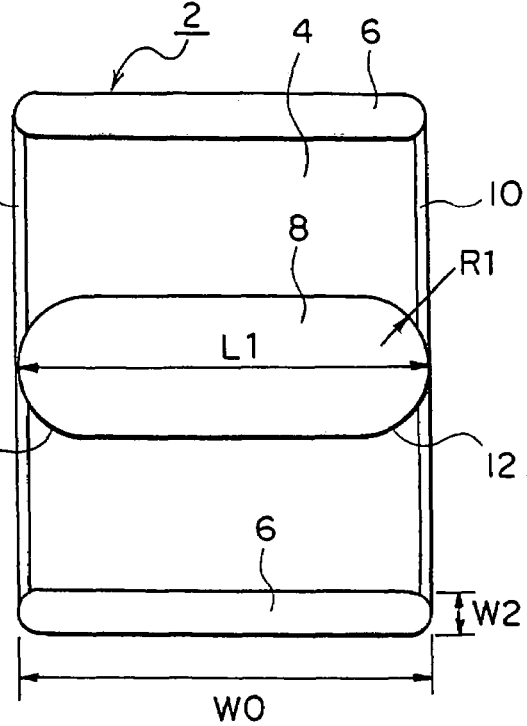 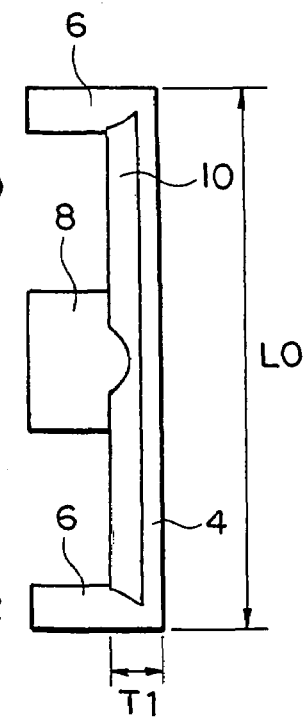
FIG. 3E
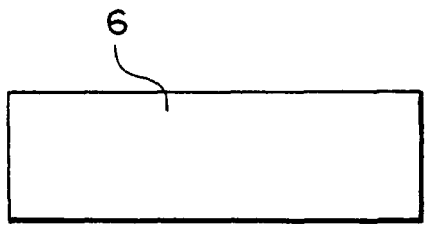

PLANAR TYPE FERRITE CORE

BACKGROUND OF THE INVENTION

1. Field of the Invention

The present invention relates to a planar type ferrite core to be attached to a coil pattern forming circuit board etc.

2. Description of the Related Art

Circuit boards are sometimes provided with so-called E-shaped planar type ferrite cores at parts of the circuit boards formed with coil patterns in order to mount transformers, inductors, and other coil devices (for example, see Japanese Patent Publication (A) No. 2003-151838).

An E-shaped planar type ferrite core generally has a rectangular flat part, a pair of outside legs projecting out from the two ends of the flat part in a-direction substantially perpendicular to the plane of the flat part, and a center leg positioned between the pair of outside legs and projecting out from the flat part in the same direction as the outside legs.

In such an E-shaped planar type ferrite core, in the past, the two ends of the center leg in the longitudinal direction were often made right angle surfaces. A coil pattern formed on the circuit board is formed by a pattern designed to surround the center leg. Therefore, if the two ends of the center leg are right angle surfaces, the coil pattern formed on the board would be wound around the right angle surfaces with great clearance and dead space would result.

In the days when reduction of the size of electronic devices including circuit boards was not demanded that much, these coil patterns did not pose any problem, but as power supplies have been reduced in size, they have come to be considered a problem. That is, there is fierce competition going on to improve the output current densities of power supplies even incrementally. Securing space for mounting electronic devices has become an element in development.

Further, in thin type power supplies used for planar type ferrite cores, reduction of the Joule's heat has become an important element in development in the same way in terms of improvement of the power efficiency.

SUMMARY OF THE INVENTION

An object of the present invention is to provide a planar type ferrite core able to shorten the overall extended length of a coil, able to reduce the Joule's heat occurring due to the flow of current, enabling mounting of an electronic device at a part of the area gained by reduction of the size of the coil, and enabling a smaller size and higher density of the power supply.

To achieve the above object, there is provided a planar type ferrite core having a rectangular shaped flat part, a pair of outside legs projecting out from two ends of the flat part in a direction substantially perpendicular to a plane of the flat part, and a center leg positioned between the pair of outside legs and projecting out from the flat part in the same direction as the outside legs, wherein the two ends of the center leg are formed with arc surfaces of a predetermined radius of curvature, and a length of the center leg in the longitudinal direction is at least 90% of a width of the flat part.

In the planar type ferrite core according to the present invention, since the two ends of the center leg are formed with arc surfaces of a predetermined radius of curvature, there is no longer any dead space with the coil pattern formed around the center leg. Therefore, the coil pattern can be reduced in size, the overall extended length of the coil can be shortened, and the Joule's heat occurring due to the flow of current can be reduced. Further, another electronic device can be mounted at the part of the area gained by the reduction of the size of the coil and the power supply can be reduced in size and raised in density.

Further, in the present invention, since the length of the center leg in the longitudinal direction is at least 90% of the width of the flat part, if making the length of the center leg the same as in the past, the width of the flat part can be reduced. As a result, the core as a whole can be made more compact, an electronic device can be mounted at the part of the area gained due to the reduction of the size of the core, and the power supply can be reduced in size and raised in density.

Preferably, the length of the center leg in the longitudinal direction is substantially the same as the width of the flat part. That is, the length of the center leg in the longitudinal direction is preferably 100% of the width of the flat part. In this case, the action and effect of the present invention are increased.

Preferably the radius of curvature of the arc surfaces formed at the two ends of the center leg is about ½ of the width of the center leg and smaller than ½ of the length of the center leg in the longitudinal direction. When the radius of curvature of the arc surfaces is about ½ of the width of the center leg, the arc surfaces become surfaces of halves of the outer circumference of a perfect circular column. In this case, if the radius of curvature of the arc surfaces were ½ of the length of the center leg in the longitudinal direction, the center leg would become a perfect circular column and reduction of the size of the core would. become difficult. Therefore, the radius of curvature of the arc surfaces is preferably about ½ of the width of the center leg and smaller than ½ of the length of the center leg in the longitudinal direction.

Preferably, the length of the center leg in the longitudinal direction is 3 to 9 times the radius of curvature of the arc surfaces formed at the two ends of the center leg. In such a range, the action and effects of the present invention are great.

Preferably, the outside legs are formed along a lateral direction of the flat part. The outside legs are parts for returning the magnetic lines of force passing through the center leg so as to form a closed magnetic circuit. The lengths of the outside legs in the longitudinal direction are preferably of the same extent as the length of the center leg.

Preferably, the center leg is inserted into a center leg through hole formed at a center of a coil pattern formed on a circuit board and the outside legs are inserted into outside leg through holes formed at the outsides of the coil pattern in the circuit board.

The opposite side of the circuit board to which the planar type ferrite core of the present invention is mounted is provided with an E-shaped planar type ferrite core of the same shape or an I-shaped planar type ferrite core of a simple flat shape so as to form a closed magnetic path coil device.

BRIEF DESCRIPTION OF THE DRAWINGS

These and other objects and features of the present invention will become clearer from the following description of the preferred embodiments given with reference to the attached drawings, wherein:

FIG. 3A is a plan view of the core shown in FIG. 1, FIG. 3B is a right side view of the same, FIG. 3C is a left side view of the same, FIG. 3D is a back view of the same, and FIG. 3E is a front view of the same;

DESCRIPTION OF THE PREFERRED EMBODIMENTS

Figure 1:
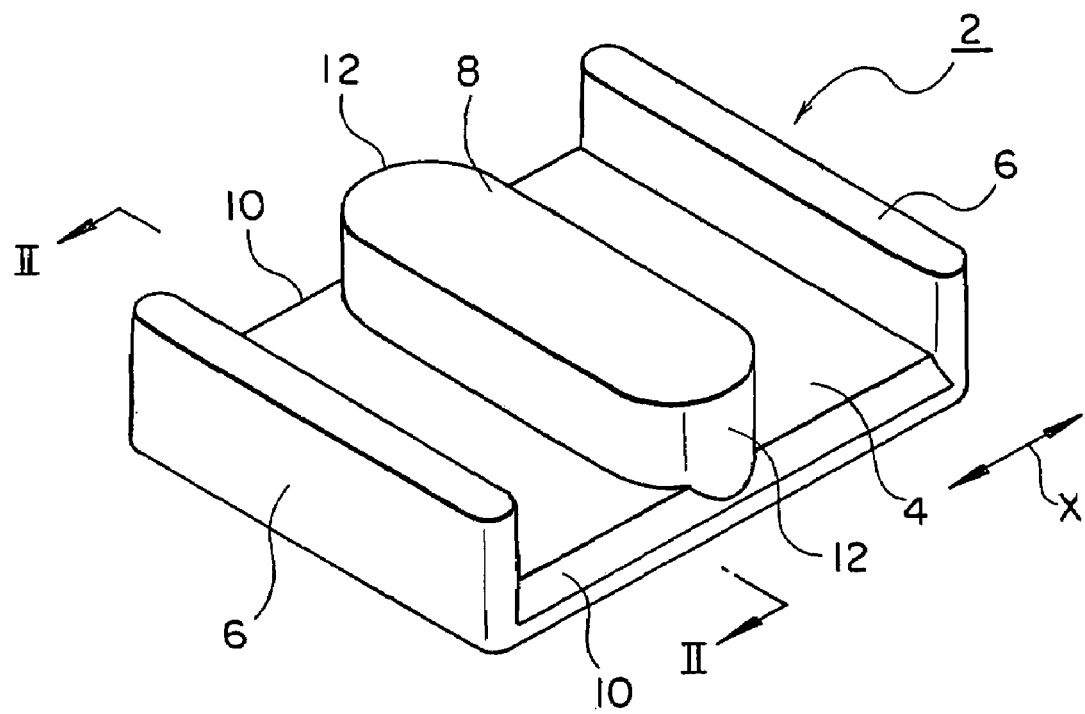
FIG. 1 is a perspective view of a planar type ferrite core according to an embodiment of the present invention.
Figure 2:
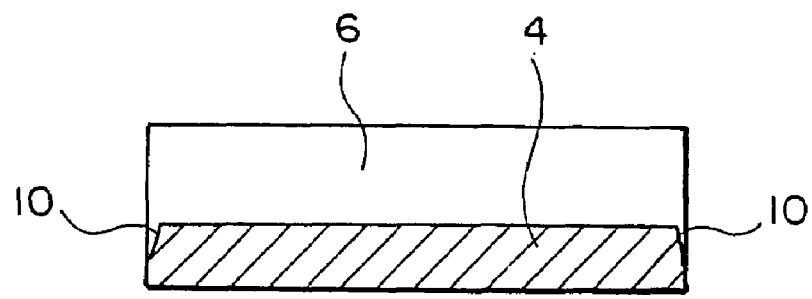
FIG. 2 is a sectional view along the line II—II shown in FIG. 1.
Figure 4:
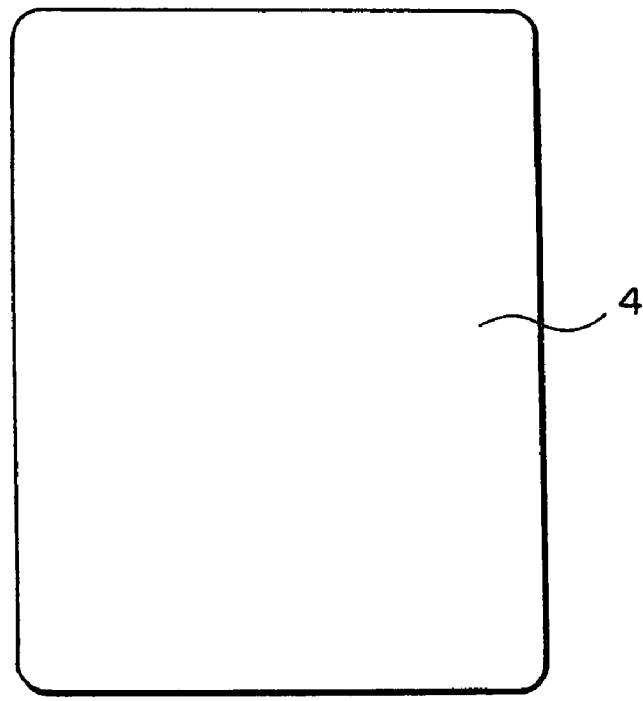
FIG. 4 is a bottom view of the core shown in FIG. 1.

As shown in FIG. 1, the planar type ferrite core 2 according to an embodiment of the present invention has a rectangular shaped flat part 4. The two ends of this flat part 4 in the longitudinal direction X are integrally formed with a pair of outside legs 6 projecting out from the ends in a direction substantially perpendicular to the plane of the flat part 4.

A center leg 8 is formed in parallel at a position between the pair of outside legs 6 in the same direction as the outside legs 6 from the plane of the flat part 4. As shown in FIGS. 3A to 3E, a height H1 of the outside legs 6 is the same as a height of the center leg 8. While not particularly limited, it is generally 1 to 10 mm.

The outside legs 6 are formed along the ends of the flat part 4. Their lengths in their longitudinal directions are the same as a width W0 of the flat part 4. The width W0 of the flat part 4 is not particularly limited, but generally is 5 to 30 mm. Further, a length L0 of the flat part 4 in the longitudinal direction is not particularly limited, but generally is a length of 100 to 400% of the width W0.

Further, a thickness T1 of the flat part 4 is not particularly limited, but generally is 0.5 to 5 mm. The top surfaces of the flat part 4 at the two ends in the width W0 direction are formed with chamfers 10.

The two ends of the center leg 8 in the longitudinal direction are formed with arc surfaces (semicolumnar side surfaces) of a predetermined radius of curvature R1. The length L1 of the center leg 8 in the longitudinal direction is at least 90% of the width W0 of the flat part 4. In the present embodiment, it is 100%. That is, the length L1 of the center leg 8 in the longitudinal direction is substantially the same as the width W0 of the flat part 4.

The radius of curvature R1 of the arc surfaces 12 formed at the two ends of the center leg 8 is about ½ of the width W1 of the center leg 8 and smaller than ½ of the length L1 of the center leg 8 in the longitudinal direction. When the radius of curvature R1 of the arc surfaces 12 is about ½ of the width of the center leg 8, the arc surfaces 12 become surfaces of halves of the outer circumference of a perfect circular column. In this case, if the radius of curvature R1 of the arc surfaces 12 were ½ of the length L1 of the center leg 8 in the longitudinal direction, the center leg 8 would become a perfect circular column and reduction of the size of the core would become difficult. Therefore, the radius of curvature R1 of the arc surfaces 12 is preferably about ½ of the width W1 of the center leg 8 and smaller than ½ of the length L1 of the center leg 8 in the longitudinal direction.

Preferably, the length L1 of the center leg 8 in the longitudinal direction is 3 to 9 times the radius of curvature R1 of the arc surfaces 12 formed at the two ends of the center leg 8. In such a range, the action and effects of the present invention are great. The radius of curvature R1 is about half of the width W1 of the center leg 8. While not particularly limited, it is preferably 1.4 to 3.2 mm or so. The widths W2 of the outside legs 6 are not particularly limited, but are about 40 to 80% of the width W1 of the center leg 8.

The material of the ferrite core 2 according to the present invention is not particularly limited. For example, an Ni—Zn—based ferrite or an Ni—Zn—Cu-based ferrite, Mn—Zn-based ferrite, Mn—Mg—Zn-based ferrite, etc. may be mentioned. This ferrite core 2 is produced for example as follows:

First, the various types of ferrite material powders (starting materials) suitably selected in accordance with the application of the ferrite core to be finally obtained are weighed and mixed to give a predetermined ratio of composition so as to obtain the starting material mixture. As the mixing method, for example, wet mixing using a ball mill and dry mixing using a dry mixer can be mentioned.

Next, the starting material mixture is calcined to obtain a calcined material. The calcination is performed to cause heat decomposition of the starting materials, homogenization of the ingredients, production of ferrite, elimination of superfine particles due to sintering, and particle growth to suitable particle sizes and to convert the starting material mixture to a form suitable for later processes. This calcination is performed preferably at a temperature of 800 to 1100° C. for usually 1 to 3 hours. The calcination may be performed in the atmosphere (air) or in an environment with a higher oxygen partial pressure than the atmosphere. Note that when including sub-ingredients in the ferrite, the main ingredient materials and the sub-ingredient materials may be mixed before the calcination or after the calcination.

Next, the calcined material is pulverized to a predetermined mean particle size and particle distribution to obtain pulverized material. The pulverization is performed to break up the agglomerates of the calcined material and produce powder having a suitable sinterability. The calcined material may be pulverized by a means known in the past such as use of a ball mill, atriter, wet media agitation type pulverizer, etc. The pulverization method may be a wet pulverization method or dry pulverization method. When the calcined material forms large masses, it is preferable to roughly pulverize it, then use a ball mill, atriter, etc. for wet pulverization. The wet pulverization is performed until the mean particle size of the calcined material becomes preferably 0.5 to 2 µm or so.

Next, the pulverized material (ferrite powder) is granulated to obtain granules (ferrite granules). the granulation is performed so as to convert the pulverized material into a form suitable for shaping, that is, suitable sizes of agglomerated particles. As the granulation method, for example, spray drying granulation, oscillating extrusion granulation, etc. may be mentioned. Specifically, the pulverized material, binder, and various types of additives as desired are dispersed in water to prepare a slurry, then the prepared slurry is spray dried by a spray dryer or else the pulverized material, binder, and various types of additives as desired are mixed and granulated in an agitator/granulator to prepare granulation powder and the granulation powder is granulated by extrusion and dried repeatedly by an oscillating granulator so as to prepare ferrite granules.

The granulation method may be suitably selected in accordance with the amount of granulation of the ferrite granules, the desired properties of the ferrite shaped article, etc. Note that the oscillating extrusion granulation method is the method of performing the task of pushing grains formed to a size of several mm through a mesh to cause finer granules to drop through in several steps while successively making the mesh finer.

The mean grain size of the ferrite granules formed can be suitably selected in accordance with the granulation method, the desired properties of the shaped article, etc. Normally, if the mean grain size is too small, the fluidity of the ferrite granules and their packability in a mold will become worse and the variation in the dimensions of the obtained shaped article and the weight of the shaped article will become greater. Further, sticking of the fine powder to the mold will more easily occur. Conversely, if the mean grain size is too large, many granular boundaries will remain in the shaped article and shaping defects will occur or the variation in dimensions and unit weight of the shaped article will increase. Therefore, ferrite cores obtained by firing such shaped articles have less defects due to granular boundaries and relatively high strength as sintered bodies as well.

The binder used for forming the ferrite granules may be suitably selected in accordance with the objective of use from binders which have been previously used for forming ferrite granules. Typically, for example, polyvinyl alcohol (PVA), polyvinyl acetal, polyacryl-based resins, cellulose-based resins, acrylamide-based resins, etc. may be mentioned. These binders may be used alone or in mixtures of two or more types.

When forming ferrite granules, in addition to the pulverized material (ferrite powder) and binder, it is also possible to include various types of known additives as desired to an extent not detracting from the object and effects of the present invention. As examples of such additives, polycarboxylates, condensed naphthalene sulfonic acid, and other dispersants, glycerin, glycols, triols, and other plasticizers, waxes, stearic acid (salts), and other lubricants, polyether-based, urethane modified polyether-based, polyacrylic acid-based, modified acrylic acid-based polymers and other organic polymer flocculating agents, aluminum sulfate, aluminum chloride, aluminum nitrate, and other inorganic flocculating agents etc. may be mentioned.

Next, the granules (ferrite granules) are molded to the shape shown in FIG. 1 by various compression molding methods such as the single-force molding method, double-force molding method, floating die method, withdrawal method, etc. to obtain the shaped article. The shaped article may be molded by for example dry molding, wet molding, extrusion, etc. The dry molding method fills the granules into a mold and presses them for shaping. As the press, a mechanical press, hydraulic press, servo press, etc. is suitably selected in accordance with the size, shape, and numbers of the articles.

Next, the shaped article is fired to obtain a sintered body (ferrite core 2 of the present embodiment). This firing is performed to cause sintering for causing cohesion of powder at a temperature of under the melting point among powder particles of the shaped article including numerous voids so as to obtain a dense sintered body. As the oven used for the firing, a batch type, pusher type, trolley type, etc. may be mentioned. The firing temperature is preferably 1000 to 1300° C., more preferably 1000 to 1200° C. The firing time is preferably 20 to 24 hours or so. The firing may be performed in the atmosphere (air) or in an environment with a higher oxygen partial pressure than the atmosphere.

Figure 5:
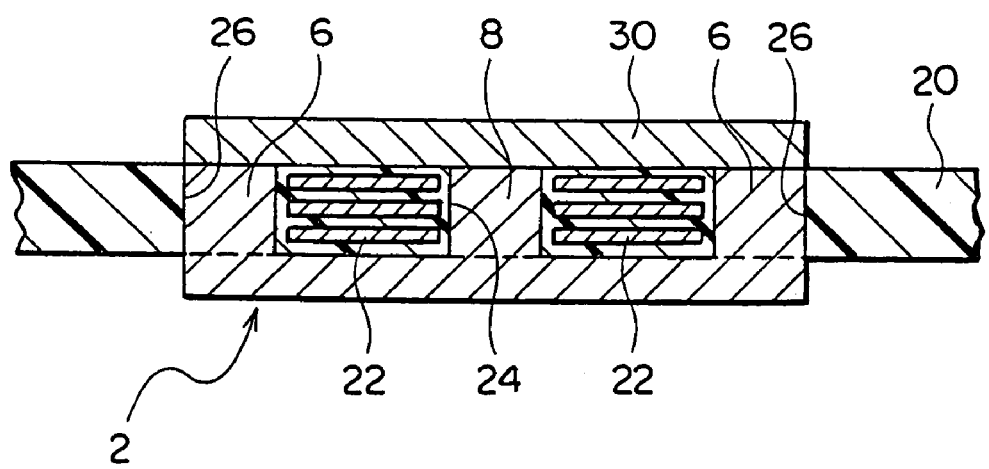
FIG. 5 is a sectional view showing the state of use of the core shown in FIG. 1.

The thus obtained ferrite core 2 is for example attached to a circuit board 20 as shown in FIG. 5. That is, the center leg 8 is inserted into a center leg through hole 24 formed at a center of a coil pattern 22 formed on the circuit board 20 and the outside legs 6 are inserted into outside leg through holes 26 formed at the outsides of the coil pattern 22 in the circuit board 20.

The opposite side of the circuit board 20 to which the planar type ferrite core 2 of this embodiment is mounted is provided with an E-shaped planar type ferrite core 2 of the same shape or an I-shaped planar type ferrite core 30 of a simple flat shape so as to form a closed magnetic path coil device.

In the planar type ferrite core 2 according to this embodiment, since the two ends of the center leg 8 are formed with arc surfaces 12 of a predetermined radius of curvature R1, there is no longer any dead space with the coil pattern 22 formed around the center leg 8. Therefore, the coil pattern 22 can be reduced in size, the overall extended length of the coil can be shortened, and the Joule's heat occurring due to the flow of current can be reduced. Further, another electronic device can be mounted at the part of the area on the circuit board 20 gained by the reduction of the size of the coil and the power supply can be reduced in size and raised in density.

Further, in this embodiment, since the length L1 of the center leg 8 in the longitudinal direction is at least 90% of the width W0 of the flat part 4, if making the length L1 of the center leg 8 the same as in the past, the width W0 of the flat part 4 can be reduced. As a result, the core 2 as a whole can be made more compact, another electronic device can be mounted at the part of the area of the circuit board 20 gained due to the reduction of the size of the core 2, and the power supply can be reduced in size and raised in density.

While the invention has been described with reference to specific embodiments chosen for purpose of illustration, it should be apparent that numerous modifications could be made thereto by those skilled in the art without departing from the basic concept and scope of the invention.

What is claimed is:

1. A planar type ferrite core having:
    a rectangular shaped flat part,
    a pair of outside legs protecting out from two ends of said flat part in a direction substantially perpendicular to a plane of said flat part, and
    a center leg positioned between the pair of outside legs and projecting out from said flat part in the same direction as said outside legs, wherein
    the two ends of said center leg are formed with arc surfaces of a predetermined radius of curvature,
    a length of said center leg in the longitudinal direction is at least 90% of a width of said flat part, and
    at least one surface of the flat part includes at least one chamfer.

2. The planar type ferrite core as set forth in claim 1, wherein the length of the center leg in the longitudinal direction is substantially the same as the width of said flat part.

3. The planar type ferrite core as set forth in claim 2, wherein the radius of curvature of the arc surfaces formed at the two ends of the center leg is about ½ of the width of the center leg and smaller than ½ of the length of the center leg in the longitudinal direction.

4. The planar type ferrite core as set forth in claim 2, wherein the length of the center leg in the longitudinal direction is 3 to 9 times the radius of curvatures of the arc surfaces formed at the two ends of the center leg.

5. The planar type ferrite core as set forth in claim 2, wherein the outside legs are formed along a lateral direction of the flat part.

6. The planar type ferrite core as set forth in claim 2, wherein:

the center leg is inserted into a center leg through hole formed at a center of a coil pattern formed on a circuit board and the outside legs are inserted into outside leg through holes formed at the outsides of the coil pattern in the circuit board.

7. The planar type ferrite core as set forth in claim 1, wherein the outside legs are formed along a lateral direction of the flat part.

8. The planar type ferrite core as set forth in claim 1, wherein the length of the center leg in the longitudinal direction is 3 to 9 times the radius of curvatures of the arc surfaces formed at the two ends of the center leg.

9. The planar type ferrite core as set forth in claim 1, wherein:

the center leg is inserted into a center leg through hole formed at a center of a coil pattern formed on a circuit board and the outside legs are inserted into outside leg through holes formed at the outsides of the coil pattern in the circuit board.

10. The planar type ferrite core as set forth claim 1, wherein the radius of curvature of the arc surfaces formed at the two ends of the center leg is about ½ of the width of the center leg and smaller than ½ of the length of the center leg in the longitudinal direction.

11. A planar type ferrite core having:

a rectangular shaped flat part, a pair of outside legs projecting out from two ends of said flat part in a direction substantially perpendicular to a plane of said flat part, and a center leg positioned between the pair of outside legs and projecting out from said flat part in the same direction as said outside legs, wherein the two ends of said center leg are formed with arc surfaces of a predetermined radius of curvature.

a length of said center leg in the longitudinal direction is at least 90% of a width of said flat part, and two ends of at least one of the pair of outside legs are formed with arc surfaces of a predetermined radius of curvature.

12. The planar type ferrite core as set forth in claim 11, wherein the length of the center leg in the longitudinal direction is substantially the same as the width of said flat part.

13. The planar type ferrite core as set forth in claim 12, wherein the radius of curvature of the arc surfaces formed at the two ends of the center leg is about ½ of the width of the center leg and smaller than ½ of the length of the center leg in the longitudinal direction.

14. The planar type ferrite core as set forth in claim 12, wherein the length of the center leg in the longitudinal direction is 3 to 9 times the radius of curvatures of the arc surfaces formed at the two ends of the center leg.

15. The planar type ferrite core as set forth in claim 12, wherein the outside legs are formed along a lateral direction of the flat part.

16. The planar type ferrite core as set forth in claim 12, wherein:

the center leg is inserted into a center leg through hole formed at a center of a coil pattern formed on a circuit board and the outside legs are inserted into outside leg through holes formed at the outsides of the coil pattern in the circuit board.

17. The planar type ferrite core as set forth in claim 11, wherein the length of the center leg in the longitudinal direction is 3 to 9 times the radius of curvatures of the arc surfaces formed at the two ends of the center leg.

18. The planar type ferrite core as set forth in claim 11, wherein the outside legs are formed along a lateral direction of the flat part.

19. The planar type ferrite core as set forth in claim 11, wherein the radius of curvature of the arc surfaces formed at the two ends of the center leg is about ½ of the width of the center leg and smaller than ½ of the length of the center leg in the longitudinal direction.

20. The planar type ferrite core as set forth in claim 11, wherein:

the center leg is inserted into a center leg through hole formed at a center of a coil pattern formed on a circuit board and the outside legs are inserted into outside leg through holes formed at the outsides of the coil pattern in the circuit board.

* * * * *